(12) United States Patent
Tabatowski-Bush et al.

(10) Patent No.: US 6,914,357 B2
(45) Date of Patent: Jul. 5, 2005

(54) ELECTRIC MACHINE WITH INTEGRATED POWER ELECTRONICS

(75) Inventors: Ben Tabatowski-Bush, Northville, MI (US); James P. Grzybowski, Novi, MI (US); Prathap A. Reddy, Farmington Hills, MI (US); John J. Trublowski, Troy, MI (US); Vivek A. Jairazbhoy, Farmington Hills, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 151 days.

(21) Appl. No.: 10/315,846

(22) Filed: Dec. 10, 2002

(65) Prior Publication Data

US 2003/0227222 A1 Dec. 11, 2003

Related U.S. Application Data

(60) Provisional application No. 60/387,773, filed on Jun. 10, 2002.

(51) Int. Cl.[7] .......................... H02K 11/04; H02K 9/19; H02K 5/20
(52) U.S. Cl. ............................ 310/71; 310/72; 310/54; 310/68 R; 439/179; 174/16.2; 174/16.3; 257/715; 361/700; 361/688
(58) Field of Search ..................... 310/71, 72, 54, 310/55, 52, 64, 68 R; 439/179; 174/133 B, 16; 180/65.1, 65.2; 257/712–715, 688; 361/719, 700, 707, 711

(56) References Cited

U.S. PATENT DOCUMENTS

| | | | |
|---|---|---|---|
| 6,198,183 B1 | * | 3/2001 | Baeumel et al. ............... 310/52 |
| 6,470,984 B1 | * | 10/2002 | Nakajima et al. .......... 180/65.2 |
| 6,703,703 B2 | * | 3/2004 | Grant ......................... 257/688 |
| 2003/0227222 A1 | * | 12/2003 | Tabatowski-Bush et al. .. 310/68 R |

FOREIGN PATENT DOCUMENTS

| | | | | |
|---|---|---|---|---|
| DE | 101 20 414 | | 10/2002 | .......... H02K/11/00 |
| EP | 0 722 210 | | 7/1996 | .......... H02K/21/22 |
| GB | 2391397 | * | 2/2004 | .......... H02K/11/04 |
| WO | WO 02/084843 | | 10/2002 | .......... H02K/11/04 |
| WO | WO 03/026104 | | 3/2003 | .......... H02K/11/04 |

* cited by examiner

Primary Examiner—Karl Imayoshi Tamai
(74) Attorney, Agent, or Firm—Brinks Hofer Gilson & Lione

(57) ABSTRACT

An electric machine for converting electrical energy to mechanical energy is disclosed. The electric machine includes a stator having an outer layer, a first intermediate layer, a second intermediate layer, and an inner layer. The electric machine further includes a rotor axially aligned and positioned within the stator. The rotor has at least one permanent magnet, and at least one busbar. The busbar is attached to the first intermediate layer. The busbar includes at least one bare power die in electrical communication therewith.

27 Claims, 7 Drawing Sheets

ELECTRIC MACHINE WITH INTEGRATED POWER ELECTRONICS

CROSS-REFERENCE TO RELATED APPLICATIONS

The present invention claims priority to U.S. Provisional Ser. No. 60/387,773, filed on Jun. 10, 2002, entitled "Machine Integrated Power".

TECHNICAL FIELD

The present invention relates to electric machines having integrated electronics.

BACKGROUND

Conventionally, electric machines have their power electronics outside the housing of the electric machine. There are at least two reasons for separating the power electronics from the electric machine. First, the volume taken up by the power electronics is such that it is difficult to package the electric machine in the intended application. Second, the environment inside an electric machine housing is significantly harsher than the conventional environment for power electronics.

One significant problem that must be addressed in power electronics apparatus is heat generation. Conventionally, a heat spreader is coupled to the power electronics to enhance heat dissipation. Metals (such as copper) are good for heat spreading, as they quickly conduct the heat away from the power die. Ceramics are not as good since their thermal conductivity is not nearly as good. Thus, metals are able to carry heat away from the die much more effectively than a ceramic substrate.

Power dies, which are central to power electronics, create a great deal of heat and must have some form of cooling technology in place to dissipate heat. Power dies are typically packaged in a large insulating (typically ceramic) substrate. One of the reasons the ceramic substrate is used is to prevent stressing the die. More specifically, the coefficient of thermal expansion (CTE) of the ceramic substrate is more closely matched to the power die than to a metal substrate. This insulating or ceramic substrate is typically soldered to a metal heat spreader. The metal heat spreader is then mounted to a heatsink in the power electronics. The ceramic packaging, metal baseplate, heatsink and solder add to thermal resistance. A system that has a very low thermal resistance will be able to cool more efficiently.

The cost and size of an electric machine can be reduced if the power electronics can be made so compact to be housed within the electric machine. Unfortunately, conventional inverters and the required cooling apparatus are too bulky to be placed inside an electric machine. Thus, a new and improved method and system for packaging power electronics is needed.

SUMMARY

In one embodiment, the present invention provides a three phase inductance motor with power electronics inside the same housing as the electric machine. The power electronics can be arranged around the circumference of the three phase inductance motor (circumference mount).

In an alternative embodiment the power electronics can arranged at the end of the motor (pancake mount).

In the circumference mount embodiment, the capacitors utilized will be belt capacitors used for DC link capacitance.

Alternatively in the circumference mount embodiment, conventional capacitors can be used for DC link capacitance.

In the pancake mount embodiment, pancake capacitors will be utilized for the DC link capacitance.

Alternatively in the pancake mount embodiment, conventional capacitors can be used for DC link capacitance.

In one embodiment, the connectors of the DC link can be integrated with the busbar.

In an alternative embodiment, the connectors of the DC link can utilize the housing of the three phase inductance motor as their housing.

In one embodiment, bare power dies are connected using wirebonds.

In an alternative embodiment, bare power dies will be connected to a busbar or a circuit board using area bonds.

In an alternative embodiment, bare power dies are treated as bFlip Chip devices, and a thermally conductive underfill material is used to conduct heat from the top of the die to a thermally conductive medium over the die, as well as to the cold plate under the die.

In an embodiment of the present invention, the bare power dies will be attached to a heat spreader by the use of a liquid metal die attach.

In a preferred embodiment, a vapor liquid heat spreader is used beneath the bare power dies and busbar to cool the power electronics.

In another embodiment of the present invention, cooling is accomplished with air cooling.

In yet another embodiment, cooling is accomplished with liquid cooling.

In yet another embodiment, busbars upon which the bare power dies are mounted will contain liquid cooling features.

In a preferred embodiment, an etched tri-metal circuit board is bonded to the bare power die to carry current.

In another embodiment, etched tri-metal is used for the control circuits.

In yet another embodiment, etched tri-metal circuit board is used for both the busbar and for the control electronics.

These and other aspects and advantages of the present invention will become apparent upon reading the following detailed description of the invention in combination with the accompanying drawings.

DETAILED DESCRIPTION

Figure 1:
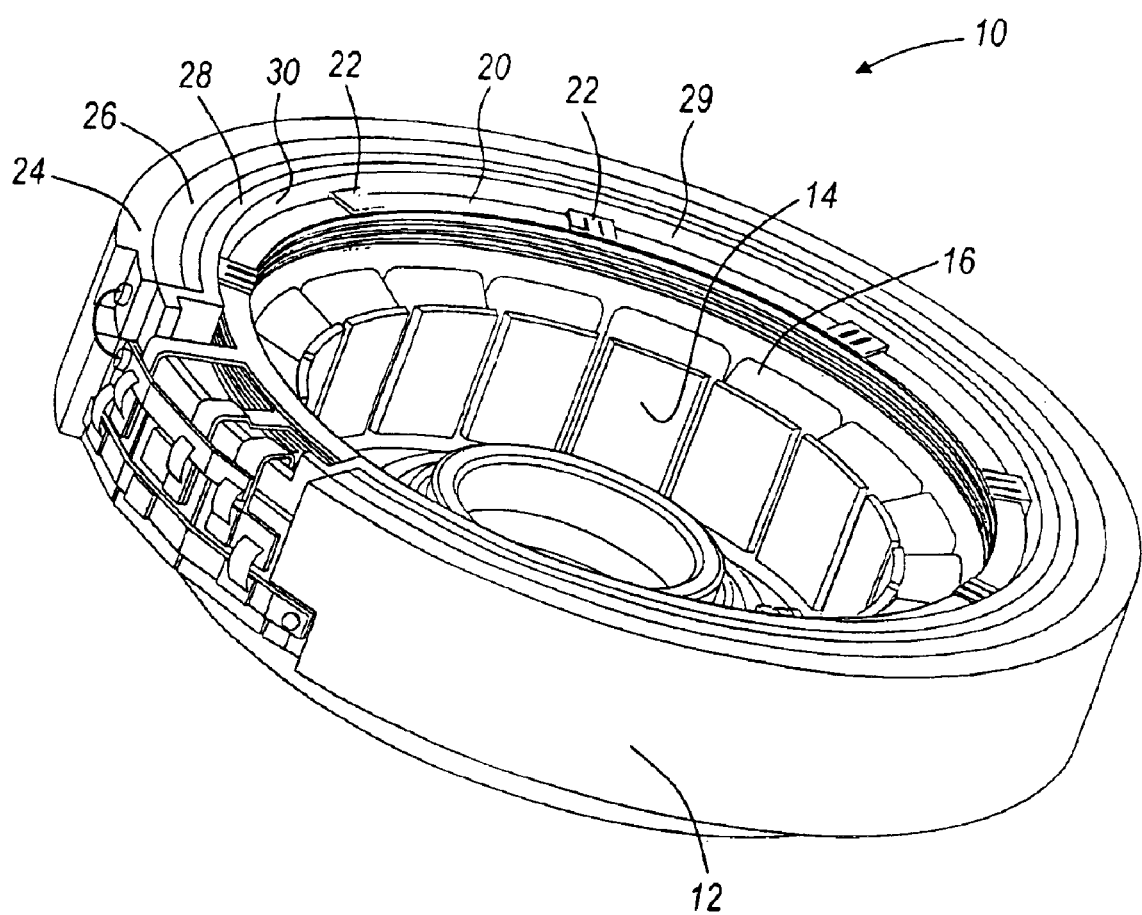
FIG. 1 is a schematic of the machine integrated power with circumference mounted power electronics, in accordance with the present invention.

Referring now to FIG. 1, an electric machine 10 is illustrated in a circumference mount configuration. Preferably, electric machine 10 is a three phase inductance motor. Electric machine 10 includes a stator 12 and a rotor 14. Stator 12 has at least four layers. The four layers are comprised of an outer layer 24, a first intermediate layer 26, a second intermediate layer 28 and an inner layer 30. The layers are coupled to each other using mechanical fasteners or by similar means. Outer layer 24 is preferably a belt capacitor. The belt capacitor serves to electrically isolate electric machine 10 from the surrounding environment. The first intermediate layer 26 is a cold plate. The cold plate is used to cool the power electronics. Second intermediate layer 28 is a thermally insulating layer. The thermally insulating layer 28 provides a barrier against heat transmission. Inner layer 30 is a structural layer that supports the previously mentioned layers. A plurality of busbar retainers 22 are fixed to an exterior surface 29 of inner layer 30. Busbar rings 20 are on the inside of inner layer 30. Busbar rings 20 are held in place by busbar retainers 22. Rotor 14 is attached to a shaft (not pictured). The shaft is mounted to a pole wheel (not pictured). Attached to rotor 14 are permanent magnets 16. When stator 12 is energized, rotor 14 will rotate when the permanent magnets 16 couple with the flux emanating from stator 12.

Figure 2:
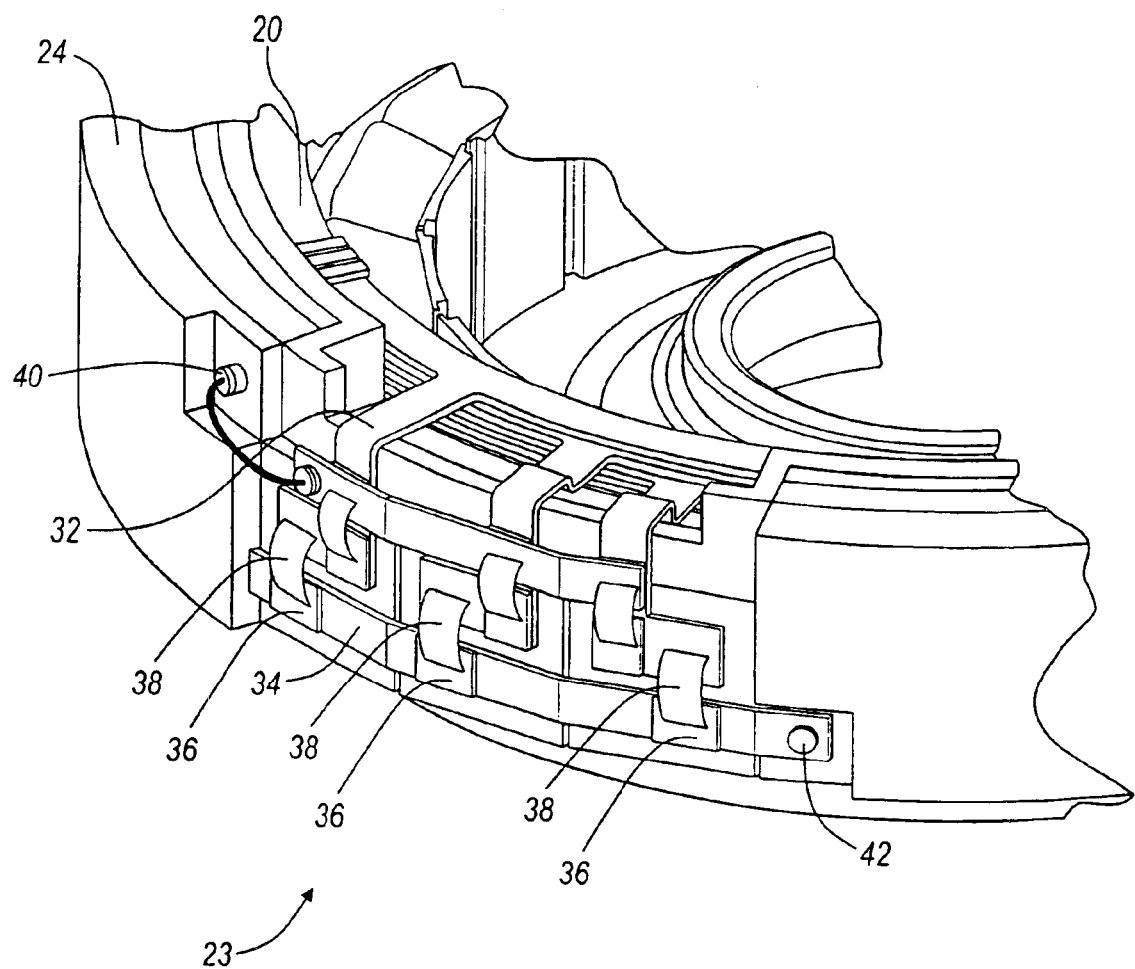
FIG. 2 is a schematic of an up close view of circumference mounted power electronics, in accordance with the present invention.

With reference to FIG. 2, power electronics 23 (including bare power dies 36) that are shown integrated into electric machine 10. Motor phase busbars 32 extend from busbar rings 20. Bare power dies 36 are mounted to a liquid cooled busbar 34. Extending from bare power dies 36 are wire bonds 38. At either end of belt capacitor 24 is a low side link 40 and a high side link 42. Here, bare power dies 36 create heat. To prevent bare power dies 36 from failing because of heat, liquid cooled busbar 34 is used to cool bare power dies 36. Wire bonds 38 connect bare power dies 36 to electric machine 10. Low side link 40 and high side link 42 connect to the power electronics to a supply current.

Figure 3:
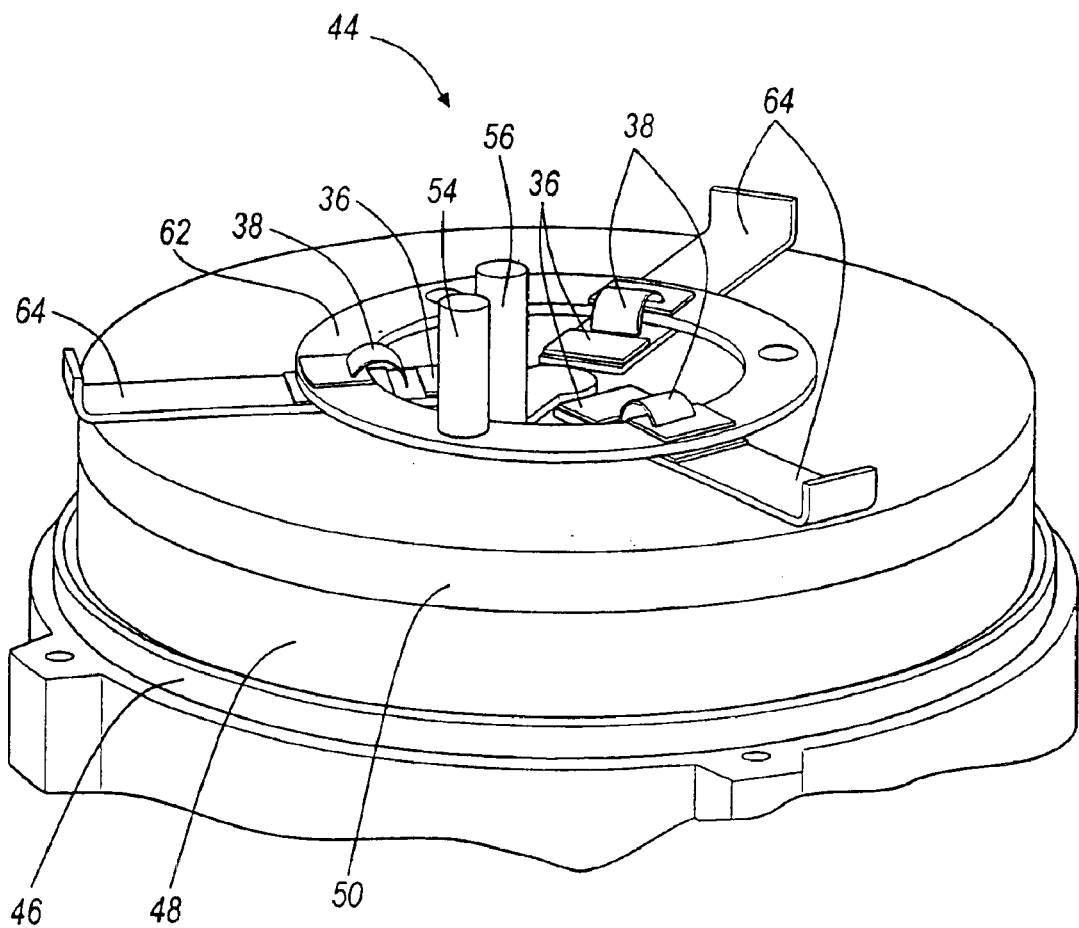
FIG. 3 is a schematic of the machine integrated power with pancake mounted power electronics, in accordance with the present invention.

In alternative embodiment, as shown in FIG. 3, electric machine 10 is a pancake mount configuration 44. For a pancake mount, power electronics 23 (i.e. bare power dies 36) are mounted at an end of electric machine 10 as opposed to the circumference mount (as shown is FIG. 1) where the power electronics are mounted around the circumference of electric machine 10. Substantially, all other aspects of the pancake mount configuration 44 are similar to the circumference mount.

Attached to motor housing 46 are at least two layers: lower layer 48 and upper layer 50. Lower layer 48 is a pancake capacitor. Upper layer 50 is a pancake cold plate. The pancake cold plate is used to cool power electronics 23 while the pancake capacitor is used to provide electrical noise insulation from electric machine 10. Projecting out from upper layer 50 is positive DC link connector 54 and negative DC link connector 56. Mounted to upper layer 50 is a high side busbar 62. Liquid cooled busbar 62 is used to cool bare power dies 36. Connecting bare power dies 36 to busbars 62 are wire bonds 38. Low side busbars 64 extend radially outward from the center of pancake mount 44. Pancake mount 44 operates substantially the same way as the circumference mount. Thus, when the stator housing (not shown) is energized, the rotor (not shown) will rotate when the permanent magnets (not shown) couple with the flux emanating from stator housing.

Figure 4:
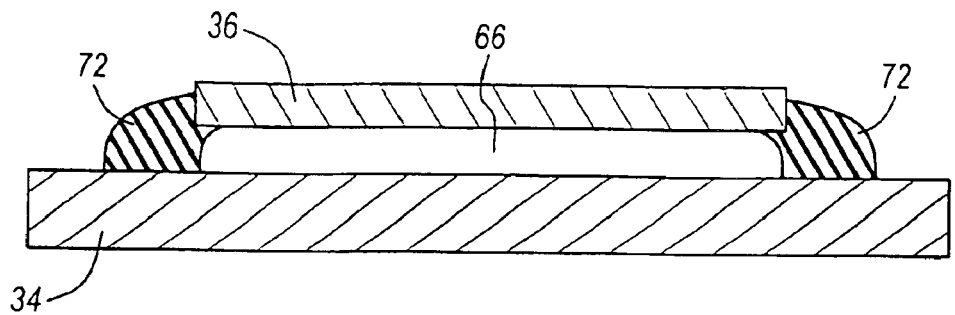
FIG. 4 is a schematic of a power die interconnect using liquid metal die attach, in accordance with the present invention.

FIG. 4 illustrates an attachment method for mounting a bare power die 36 to a liquid cooled busbar 62. A liquid metal die attach 66 is deposited between liquid cooled busbar 34, which for a pancake mount is high side and low side busbar 62 and 64, and bare power die 36. A sealant 72 serves to bond bare power die 36 to liquid cooled busbar 34 and contain liquid metal die attach 66 between liquid cooled busbar 34 and bare power die 36. In operation, liquid metal die attach 66 absorbs heat from bare power die 36. As liquid metal die attach 66 heats up, the CTE of liquid metal die attach 66 closely resembles that of bare power die 36, so stress induced damage to bare power die 36 is eliminated. In turn, liquid metal die attach 66 conducts heat to the liquid cooled busbar 34. The construction and operation of liquid cooled busbar 34 will be described hereinafter.

Figure 5A:
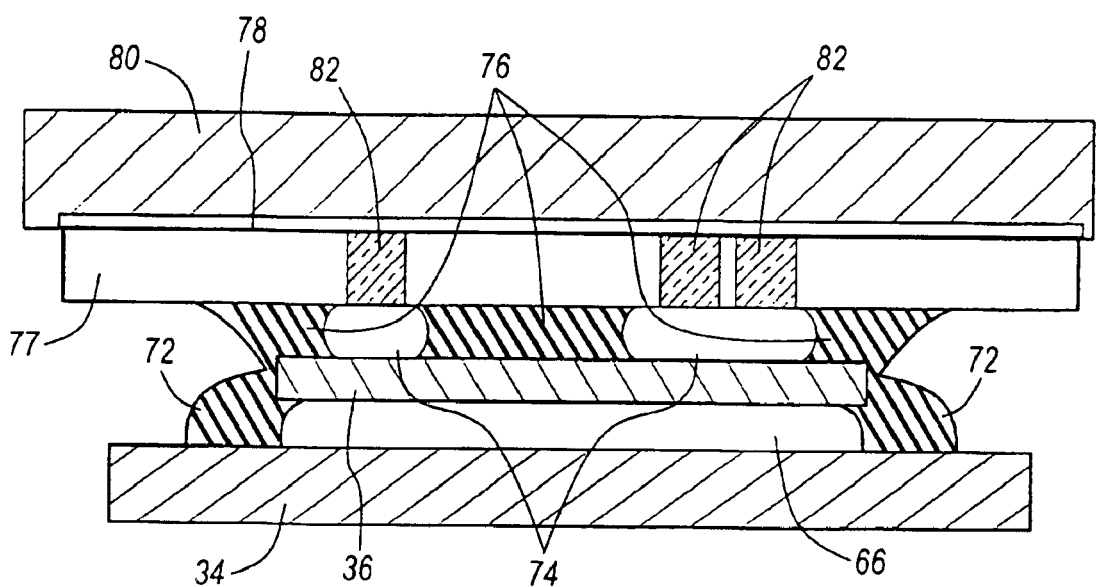
FIG. 5A is a schematic diagram of a power die interconnect using liquid metal die attach and flip chip technology, in accordance with the present invention.

FIG. 5A illustrates alternative attachment methods for bare power dies 36. Similar to the attachment method illustrated in FIG. 4, liquid metal die attach 86 is deposited between bare power die 36 and liquid cooled busbar 34. Liquid metal die attach 66 is held in place by sealant 72. However, in contrast to previously described embodiments, bare power die 36 is connected to the power electronics via the use of electrical interconnect liquid metal die attach 74 from the top of bare power die 36. Similar to liquid metal die attach 66, electrical interconnect liquid metal die attach 74 has sealant 76 that holds the liquid metal die attach used for electrical interconnect in place. The electrical interconnect liquid metal die attach 74 bands bare power die 36 to interconnect substrate 77. The interconnect substrate 77 transfers thermal energy from bare power die 36 to a top side heat sink 80. Further, a thermal adhesive 78 is disposed between interconnect substrate 77 and heat sink 80 to facilitate heat transfer. Above the thermal adhesive is a top side heat sink 80. The role of the thermal adhesive 78 and the top side heatsink 80 is to provide additional cooling to the bare power die 36.

Figure 5B:
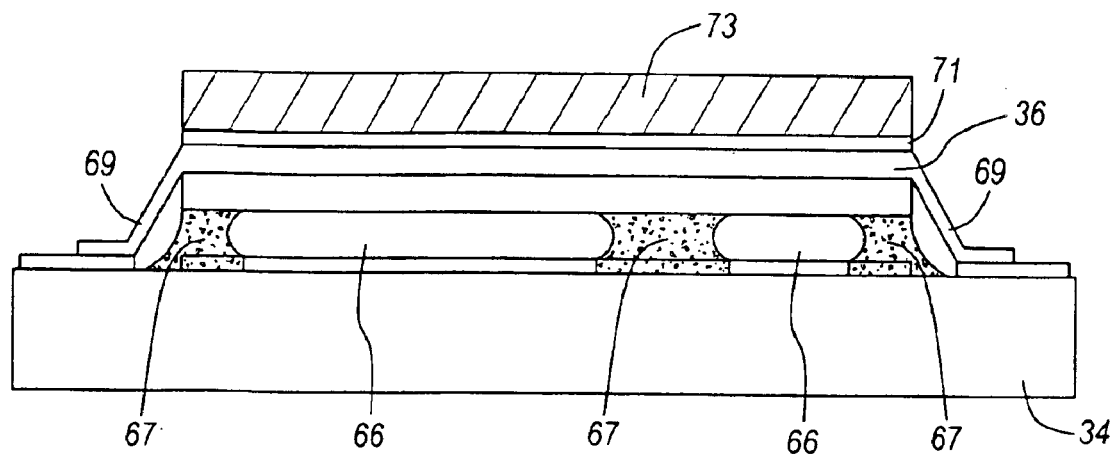
FIG. 5B is a schematic diagram of another embodiment of a power die interconnect using liquid metal die attach and flip chip technology, in accordance with the present invention.

In yet another embodiment of the present invention, an alternative attachment method for attaching bare dies 36 to liquid cooled busbar 34 is provided and illustrated in FIG. 5B. In the present attachment method, bare power die 36 is secured to busbar 34 using liquid metal die attach 66, which forms a mechanical as well as an electrical connection to busbar 34. Epoxy 67 acts as an underfill and contains liquid die attach 66 within a predefined area. For example, liquid die attach 66 may electrically interconnect bare power dies gate and source to busbar 34. Further, a conductive metallic tab 69 is provided over and soldered to a top surface of bare die 36 for providing electrical connection to busbar 34. For example, metal tab 69 may connect a drain of bare power die 36 to busbar 34. An adhesive layer 71 is provided over metal tab 69 for adhering a heat sink 73 to metal tab 69. Thus, heat is transferred to the substrate and heat sink using both sides of die 36. Epoxy or underfilment 67 is provided to accommodate for mismatch in thermal coefficients of expansion.

Figure 5C:
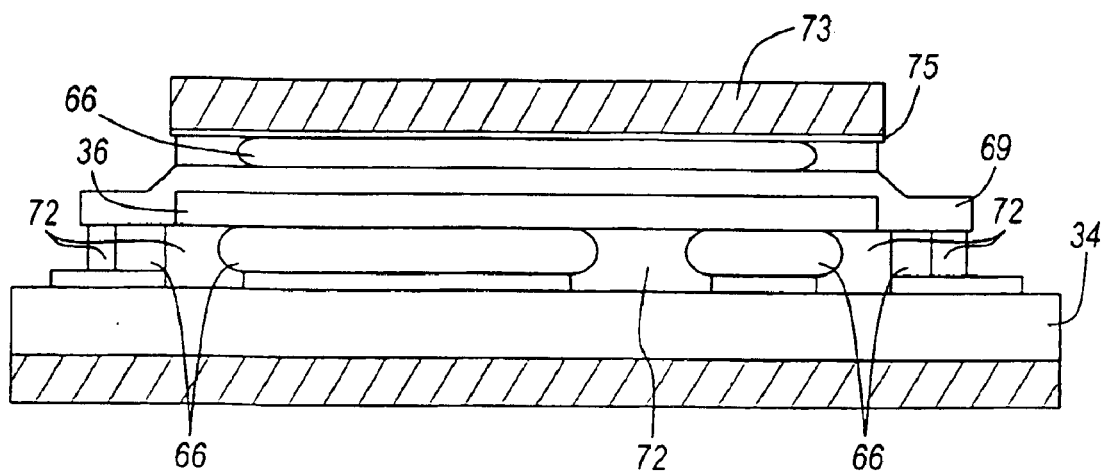
FIG. 5C is a schematic diagram of yet another embodiment of a power die interconnect using liquid metal die attach and flip chip technology, in accordance with the present invention.

Referring now to FIG. 5C an alternate method for attaching power die 36 to busbar 34 is illustrated, in accordance with the present invention. Bare power die 36 is electrically interconnected to busbar 34 using liquid metal die attach 66 within a predefined area and an adhesive sealant 72. Adhesive sealant 72 contains liquid metal die attach 66 as well as provides adhesion of bare power die 36 to busbar 34. Further, a metal tab connection 69 electrically interconnects a drain of bare power die 36 to busbar 34. Further, a heat sink 73 is adhered or attached to metal tab connection 69 with liquid metal die attach 66. Additionally, heat sink 73 has a bottom surface 75 that includes an electrically insulating but thermally conducting material. Bottom surface 75 may be flame or blast sprayed with a ceramic or may be anodized aluminum.

Figure 6:
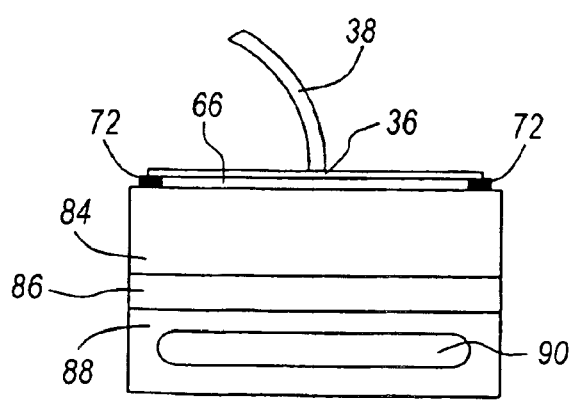
FIG. 6 is a schematic diagram of a liquid cooled busbar with an attached power die, in accordance with the present invention.

FIG. 6 is cross-sectional view of bare power die 36 and liquid cooled busbar 34 or pancake mount busbar 62, as shown in FIG. 2 and FIG. 3, respectively. As shown, bare power die 36 is bonded to electrically conductive busbar 84 via liquid metal die attach 66 and sealant 72. Coupled to and extending from bare power die 36 is wire bond 38. Further, electrically conductive busbar 84 is coupled to an electrically insulative material 86. In turn, electrically insulative material 86 is coupled to a thermally conductive material 88. Defined within thermally conductive material 88 is cooling channel 90.

In operation, liquid metal die attach 66 transfers heat from the bare power die 36 to electrically conductive busbar 84. Electrically conductive busbar 84 is electrically insulated from thermally conductive material 88 by insulative material 86. To cool bare power die 36, cooling channel 90 is filled with a liquid that absorbs heat from thermally conductive material 88.

Figure 7A:
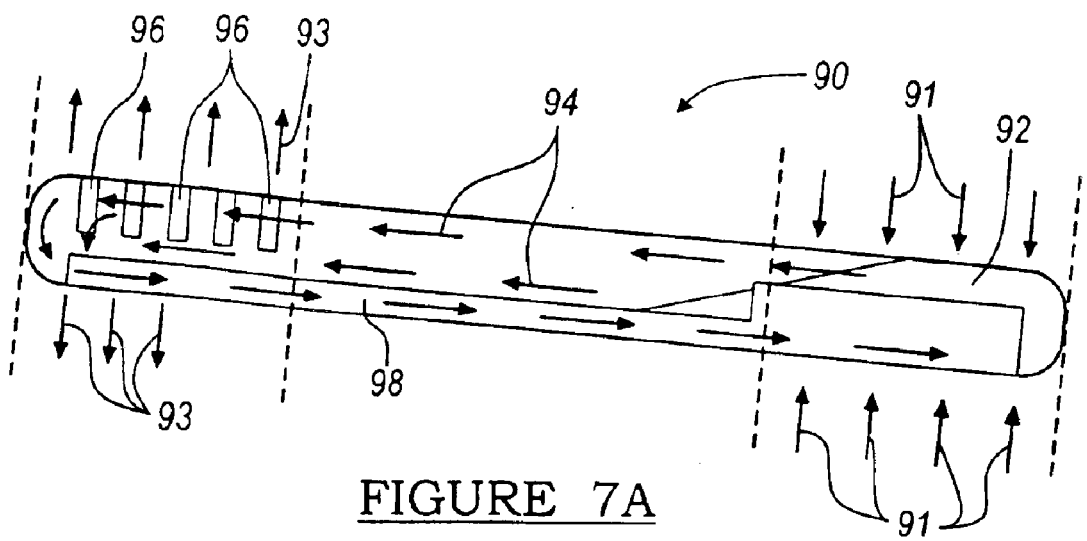
FIG. 7A is a schematic diagram of a vapor liquid heat spreader, in accordance with the present invention.

An alternative form of cooling busbar 84 is a vapor liquid heat spreader (VLHS) 90, as shown in FIG. 7A. Liquid 92 is heated by the power electronics. As the liquid heats up, it becomes vapor (as indicated by arrow 94). Vapor 94 rises to the top of VLHS 90 where it is cooled by fins 96. Vapor 94 then cools and becomes liquid 92. Conductive porous material 98 channels liquid 92 back down to the bottom of VLHS 90 and then the process repeats itself. Arrows 91 indicate where heat is absorbed by VLHS 90 and arrows 93 indicate where heat Is expelled from VLHS 90.

Figure 7B:
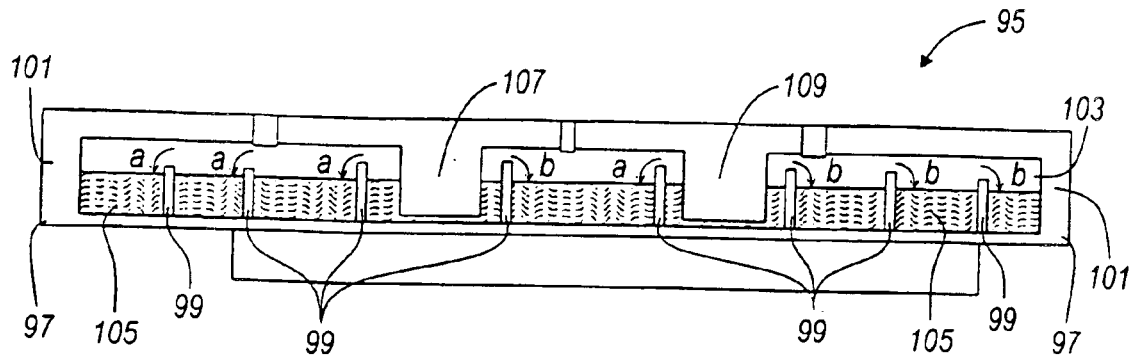
FIG. 7B is a schematic diagram of another embodiment of a vapor liquid heat spreader, in accordance with the present invention.

Referring now to FIG. 7B an alternate embodiment of a vapor liquid heat spreader 95 is illustrated, in accordance with the present invention. Vapor liquid heat spreader 95 includes a cold plate 97 having a plurality of fins or condenser plates 99. Further, cold plate 97 includes sides 101 which define, along with cold plate 97, a cavity 103. Within cavity 103 is a dielectric liquid 105. Further, evaporators 107 and 109 are provided for vaporizing dielectric liquid 105. Pressure build-up at the evaporator forces the vapor of the dielectric liquid to radiate outward as indicated by arrows A and B. The vapor of the dielectric liquid condenses over a wide area spreading its latent heat. The cold plate is cooled by free or forced convection of air or liquid. Condensate is returned to evaporator 107 or 109 by capillary action or gravity.

Figure 7C:
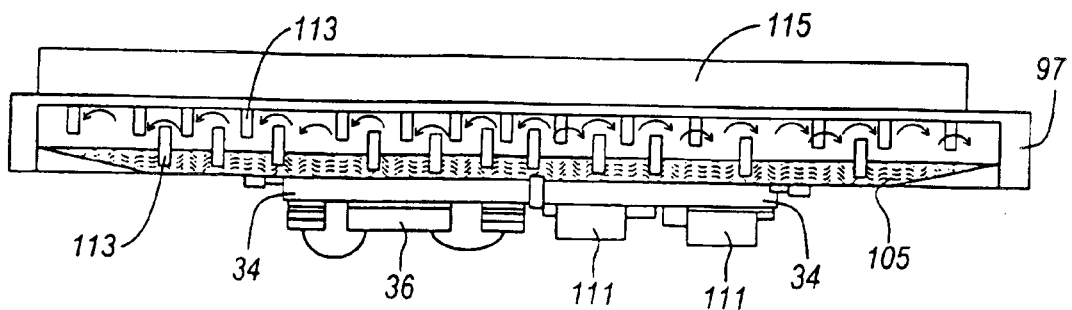
FIG. 7C is a schematic diagram of yet another embodiment of a vapor liquid heat spreader, in accordance with the present invention.

Referring now to FIG. 7C a schematic diagram illustrates the attachment of bare power die 36 to cold plate 97. Bare power die 36 would in one embodiment be attached to a busbar 34 by methods previously described. In operation, power die 36, as well as other electronic components 111 attached to busbar 34, will create heat which will be dissipated by dielectric liquid 105. Evaporators 113 are submerged in dielectric liquid 105. A plurality of cooling fins 115 are disposed along cold plate 97 to dissipate heat generated by bare power dies 36 and electronic components 111. As the vapor of dielectric 105 rises and spreads, latent heat is transferred to cooling fins 115.

The vapor liquid heat spreaders of the present invention have many advantages over prior art heat spreaders. For example, the vapor liquid heat spreaders eliminate bulky and heavy metallic slabs, in traditional heat spreaders. Further, the thermal stack is simplified resulting in a reduced cost. Additionally, an insulating element is provided in the thermal stack to prevent electrical transmission. Thus, the resulting heat spreader has enhanced thermal performance.

Figure 8:
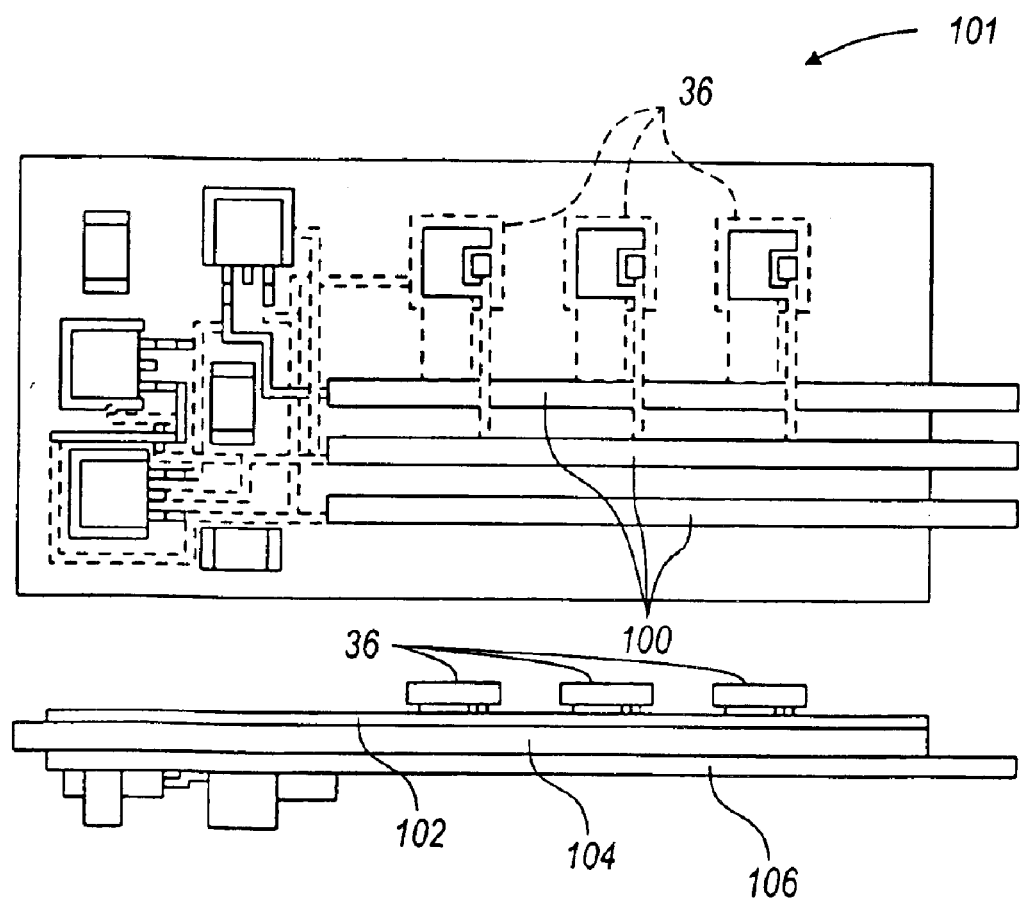
FIG. 8 is a schematic diagram of an integrated electrial etched tri metal busbar connector, in accordance with the present invention.

FIG. 8 shows the use of etched tri-metal (ETM) technology to construct a busbar 100. Generally, ETM circuit board 106 has three layers: an upper layer 102, a middle layer 104 and a lower layer 106. In an embodiment of the present invention, upper layer 102 and lower layer 106 are made of copper and middle layer 104 is made of aluminum. U.S. Pat. No. 3,801,388 to Akiyama et al., U.S. Pat. No. 4,404,059 to Livshits et al., U.S. Pat. No. 5,738,797 to Belke, Jr. et al. and U.S. Pat. No. 6,381,837 to Baker et al, all of which are incorporated herein by reference, disclose various methods for constructing ETM circuit boards. Bare power dies 36 are area bonded to busbars 100. Busbars 100 are cooled by specially etched forced or free convection cooling constructions, integrated with traditional control electronics, connected to external electrical systems by etched connector features, etched to construct electronic circuitry and populated with electronic content.

Advantages and benefits of the present invention include elimination of separate components through integration, which includes elimination of the interconnection system between the inverter and motor. Normally, this would consist of a large connector on both the inverter and the motor and a large shielded cable in-between. The elimination of these components significantly decreases the volume, cost and weight of the electric machine. Elimination of the inverter housing, which is the heaviest part of the inverter, includes a combination of busbar and connector contacts, a combination of the connector housing with module housing, and a combination of motor phase busbars with power electronic busbars.

Shrinking the volume of required components involves maximization of the use of packaging space through utilization of pancake capacitors and shrinking the volume requirement of the DC link capacitance by the cooling approaches described above. This is accomplished by placing the pancake capacitor just inside the electronics coldpate.

In conventional inverters, the busbars are large because they serve to connect electronic components that are bulky and are spread out in space. By the elimination of power switch packaging and utilizing a capacitor package which is optimized for the inverter package, all of the connection points are brought close together which allows for significant reduction in the busbar size, weight, and cost. The volume taken up by the power switches is greatly reduced as the bare power dies are introduced directly into the inverter package. Ordinarily, a standard transistor package must be utilized, and the inverter package mechanicals need to be designed around it. In the present invention, the switches are bare power dies, and the dies are placed in a configuration to minimize the size requirement for the overall inverter.

Improvement of the electrical and thermal properties of the inverter through integration is achieved, since the bare power dies can be mounted closer to the DC link busbar. The electromagnetic compatibility (EMC) of the inventor-motor combination of the present invention is much improved, since the power dies are in close proximity to the motor phase windings, where the power is produced or consumed, and then the assembly is enclosed in a single, thick metallic housing. The inductance from the bare power die to DC link is greatly reduced, since there is a direct metal attachment (liquid metal die attach) between the die and the copper DC link busbar.

As any person skilled in the art of electric machines having integrated electronics will recognize from the previous detailed description and from the figures and claims, modifications and changes can be made to the preferred embodiments of the invention without departing from the scope of this invention defined in the following claims.

What is claimed is:

1. An electric machine for converting electrical energy to mechanical energy, the electric machine comprising:
    a stator having an outer layer, a first intermediate layer, a second intermediate layer, and an inner layer, wherein the outer layer forms a belt capacitor;
    a rotor axially aligned and positioned within the stator, the rotor having at least one permanent magnet; and
    at least one busbar attached to the first intermediate layer, wherein the busbar includes at least one bare power die in electrical communication therewith.

2. The electric machine of claim 1 wherein the layers are mechanically fastened to one another.

3. The electric machine of claim 1 wherein the first intermediate layer is a cold plate.

4. The electric machine of claim 3, wherein the cold plate further comprises a vapor liquid heat spreader.

5. The electric machine of claim 4 wherein the vapor liquid heat spreader includes a dielectric liquid in contact with the cold plate and an evaporator.

6. The electric machine of claim 5 wherein the cold plate has a plurality of cooling fins.

7. The electric machine of claim 3 wherein the cold plate includes a cooling channel filled with a heat absorbing liquid.

8. The electric machine of claim 1 wherein the second intermediate layer is a thermally insulating layer.

9. The electric machine of claim 1 wherein the inner layer is a structural layer that supports the electric machine.

10. The electric machine of claim 1 further comprising a plurality of busbar rings attached to the stator and in electrical communication with the busbar.

11. The electric machine of claim 10, further comprising at least one busbar retainer fixedly secured to the stator for supporting the busbar rings.

12. An electric machine for converting electrical energy to mechanical energy, the electric machine comprising:
    a stator having an outer layer, a first intermediate layer, a second intermediate layer, and an inner layer;
    a rotor axially aligned and positioned within the stator, the rotor having at least one permanent magnet; and
    at least one busbar attached to the first intermediate layer, wherein the busbar includes at least one bare power die in electrical communication therewith, and wherein the bare power die is attached to the at least one busbar using a liquid metal die attach.

13. The electric machine of claim 12 wherein the layers are mechanically fastened to one another.

14. The electric machine of claim 12 wherein the outer layer is a belt capacitor.

15. The electric machine of claim 12 wherein the first intermediate layer is a cold plate.

16. The electric machine of claim 15 wherein the cold plate further comprises a vapor liquid heat spreader.

17. The electric machine of claim 16 wherein the vapor liquid heat spreader includes a dielectric liquid in contact with the cold plate and an evaporator.

18. The electric of claim 17 wherein the cold plate has a plurality of cooling fins.

19. The electric machine of claim 15 wherein the cold plate includes a cooling channel filled with a heat absorbing liquid.

20. The electric machine of claim 12 wherein the second intermediate layer is a thermally insulating layer.

21. The electric machine of claim 12 wherein the inner layer is a structural layer that supports the electric machine.

22. The electric machine of claim 12 further comprising a plurality of busbar rings attached to the stator and in electrical communication with the busbar.

23. The electric machine of claim 22, further comprising at least one busbar retainer fixedly secured to the stator for supporting the busbar rings.

24. The electric machine of claim 12 wherein a sealant is disposed around a periphery of the bare power die to adhere the bare power die to the busbar and contain the liquid metal die attach under the bare power die.

25. The electric machine of claim 12 wherein a bottom surface of the bare power die is electrically interconnected to the busbar using the liquid metal die attach.

26. The electric machine of claim 12 wherein a top surface of the bare power die is electrically interconnected to the busbar.

27. An electric machine for converting electrical energy to mechanical energy, the electric machine comprising:
    a stator having an outer layer, a first intermediate layer, a second intermediate layer, and an inner layer, wherein the first intermediate layer is a cold plate, and the cold plate includes a vapor liquid heat spreader;
    a rotor axially aligned and positioned within the stator, the rotor having at least one permanent magnet; and
    at least one busbar attached to the first intermediate layer, wherein the busbar includes at least one bare power die in electrical communication therewith.

* * * * *